United States Patent
Liu et al.

(10) Patent No.: US 12,158,310 B2
(45) Date of Patent: Dec. 3, 2024

(54) LOW-PRESSURE HEAT PIPES AND HEAT TRANSFER METHODS USING LOW-PRESSURE FOR HEAT PIPES

(71) Applicant: HONEYWELL INTERNATIONAL INC., Charlotte, NC (US)

(72) Inventors: Tao Liu, Shanghai (CN); Yong Zhou, Shanghai (CN); Enxin Lin, Shanghai (CN)

(73) Assignee: HONEYWELL INTERNATIONAL INC., Charlotte, NC (US)

(*) Notice: Subject to any disclaimer, the term of this patent is extended or adjusted under 35 U.S.C. 154(b) by 292 days.

(21) Appl. No.: 17/478,392

(22) Filed: Sep. 17, 2021

(65) Prior Publication Data
US 2022/0107138 A1 Apr. 7, 2022

Related U.S. Application Data

(63) Continuation-in-part of application No. PCT/CN2020/116140, filed on Sep. 18, 2020.

(51) Int. Cl.
*F28D 15/04* (2006.01)
(52) U.S. Cl.
CPC .................... *F28D 15/04* (2013.01)
(58) Field of Classification Search
CPC ........... F28D 15/04; F28D 15/06; F25B 43/04

USPC .................................................. 165/104.21
See application file for complete search history.

(56) References Cited

U.S. PATENT DOCUMENTS

| | | | | |
|---|---|---|---|---|
| 3,673,306 A | * | 6/1972 | Kirkpatrick | H01L 23/42 174/16.3 |
| 3,933,198 A | * | 1/1976 | Hara | F25D 11/025 165/274 |
| 5,771,967 A | * | 6/1998 | Hyman | B64G 1/50 126/45 |
| 6,209,625 B1 | * | 4/2001 | Guo | F28D 15/0258 165/104.27 |
| 2016/0181676 A1 | * | 6/2016 | Nubbe | H01M 50/271 429/72 |

OTHER PUBLICATIONS

Jianjuan Yuan et al, Effect of non-condensable gas on thermal characteristics in two phase closed thermosyphon, Jun. 5, 2020, Applied Thermal Engineering 173, pp. 1-12. (Year: 2020).*

* cited by examiner

*Primary Examiner* — Tho V Duong
(74) *Attorney, Agent, or Firm* — FisherBroyles, LLP; Joseph F. Posillico

(57) ABSTRACT

Heat pipes and low-pressure working fluids used for heat pipes are described, by charging the low pressure working fluids with a level of non-condensable gases of less than 1% by volume, and the heat pipes can provide better thermal performance than aluminum plates while little or no additional cost is introduced for degassing.

19 Claims, 4 Drawing Sheets

LOW-PRESSURE HEAT PIPES AND HEAT TRANSFER METHODS USING LOW-PRESSURE FOR HEAT PIPES

CROSS REFERENCE

The present invention relates to and claims the priority benefit of PCT/CN2020/116140, filed Sep. 18, 2020, which is incorporated herein by reference in its entirety.

FIELD

The present invention relates to heat pipes and to methods, systems and working fluids used in heat pipes.

BACKGROUND

As used herein, the term "heat pipe" means a heat transfer device which includes a liquid heat transfer fluid in an evaporating section and vaporous working fluid in a condensing section and which uses the motive force of vaporization to move the vaporous fluid from the evaporating section to the condensing section and little or no energy input to move the liquid working fluid back to the evaporating section.

One of the most common types of heat pipes is depicted in FIG. 1, which is commonly known as a gravity-return heat pipe or thermosiphon heat pipe. This type of heat pipe relies, at least in part, on the force of gravity to return the liquid working fluid from the condensing section to the evaporating section. As illustrated in FIG. 1, in a typical gravity-return configuration the heat pipe is a sealed container arranged with its long axis vertically with an evaporating section located in a lower portion of the pipe and a condensing section located in an upper portion of the heat pipe. Although the gravity return heat pipe in FIG. 1 is illustrated in a vertical position, it will be appreciated that some gravity-return heat pipes are not oriented with the long axis exactly vertically but at an angle of incline, which angle will be selected by the particular needs of a given applications. Accordingly, the term "gravity-return" heat pipe as used herein includes heat pipes at all incline angles and up to vertical. The evaporating section contains a working fluid in liquid form that absorbs heat from the item, body or fluid to be cooled and is thereby boiled to form a vapor of the working fluid. Boiling of the working fluid in the evaporation section causes a pressure differential and drives the vapor into the condensing section. Vaporous working fluid in the condensing section releases heat to the chosen heat sink (for example, ambient air) and is thereby condensed to form liquid working fluid at or proximate to the inside surface of the heat pipe. This liquid then returns under the force of gravity to the evaporating section and joins the liquid working fluid contained there.

As mentioned above, boiling increases the mass of vapor in the evaporating section, and since the mass of vapor is reduced in the condensing section, a pressure differential is created which drives the vapor from the boiling section to the condensing section, thus creating a continuous heat transfer cycle that requires no energy input (other than the heat absorbed in the cooling operation) to transport the working fluid from the evaporator section to the condenser section.

In some applications it is desired to arrange the heat pipe horizontally or at an incline. In the case where the heat pipe is arranged with its long axis fully horizontal, it is common that the heat pipe is known as a capillary-return heat pipe, or wicking heat pipe, an example of which is shown in FIG. 2.

In an arrangement of the type shown in FIG. 2, heat is absorbed into the liquid working fluid in the evaporating section (shown on the left in FIG. 2) causing the liquid to boil, which as described above provides a pressure differential to move the vapor to the condensing section. However, rather than relying solely on the force of gravity to return condensed liquid working fluid, a wicking structure is provided adjacent to the container wall that causes, through capillary action, a flow of the condensed working fluid to return from the condensing section to the evaporating section. Although the capillary return heat pipe in FIG. 2 is illustrated in a horizontal position, it will be appreciated that capillary return heat pipe can be oriented in virtually any orientation depending on the needs and specific geometry and capillary force needed for a given application. Accordingly, the term "capillary-return" heat pipe as used herein includes heat pipes that have a capillary return force, independent of the orientation of the heat pipe.

As a result of the very high heat transfer coefficients for boiling and condensation, heat pipes are highly effective thermal conductors. Heat pipes are therefore used in many applications, particularly electronic device cooling, such as central processing unit (CPU) cooling, LED cooling, energy recovery such as data center cooling recovery between cold air and hot air and space craft thermal control such as satellite temperature control.

In addition to the gravity-return heat pipe and the capillary-return heat pipe (and to heat pipes which simultaneously use both gravity force and capillary for to return liquid), described above, there are a number of other heat pipes which can be characterized, and which are within the scope of the present invention as described herein, depending on the mechanism which uses little or no additional energy to return the working fluid condensate to the evaporating section, as summarized in the table below:

| Methods of condensate return | Referred to As |
| --- | --- |
| Centripetal force | Rotating heat pipe |
| Electrokinetic force | Electrohydrodynamic heat pipe |
| | Electro-osmotic heat pipe |
| Magnetic forces | Magnetohydrodynamic heat pipe |
| | Magnetic fluid heat pipe |
| Osmotic forces | Osmotic heat pipe |
| Oscillate forces | Oscillating heat pipe |

Many of the working fluids for heat pipes fall into the category of high pressure working fluids. For example, 1,1,2-tetrafluororethane (R-134a), which has been frequently used in heat pipes of all types, has a normal boiling point of −15.3° F., which means that at about room temperature (e.g., about 75° F.) the vapor pressure of R-134a is approximately 78 psig. As the term is used herein, therefore, a high pressure working fluid for a heat pipe is one that has a vapor pressure (or an initial vapor pressure for a fluid with a boiling point range) substantially above atmospheric at about room temperature, that is, a normal boiling point (or bubble point in the case of a fluid with a boiling point temperature range) well below room temperature. In contrast, the term low pressure working fluid for a heat pipe, as used herein, is one that has a vapor pressure (or an initial vapor pressure for a fluid with a boiling point range) near or substantially above atmospheric at about room temperature, that is, a normal boiling point (or bubble point for fluids with a boiling temperature range) near or well above room temperature.

For heat pipes operating with high-pressure working fluids, the Air-Conditioning, Heating, & Refrigeration Institute (AHRI) has determined that air and other NCG concentrations in such high pressure fluids should not exceed 1.5% by volume measured at 25° C. (See AHRI Standard 700-2019). This same AHRI standard notes, however, that the presence of air and other NCG is not regulated for low pressure working fluids, that is, working fluids having normal boiling points near or above room temperature.

As explained in US 2004/0105233, there is a need in the information technology and computer industries for means to provide increasingly efficient and effective heat removal technologies. For example, portable electronic devices, such as notebook computers, smart phones, tablets, i-pads and the like are becoming lighter, thinner, shorter and/or smaller while at the same time possessing powerful calculation, communication and data processing capability. As a result, central processing units (CPUs) and other electronic components used in such devices have become more complicated in order to provide more powerful functions for users and application software, but these advances come at the price of higher power consumption, which in turn elevates the heat generated and/or the working temperature of those components.

One potential disadvantage of the use of high pressure working fluids in some heat pipe applications, including particularly in those in many electronics applications, is that the materials of construction and fabrication methods must result in a heat pipe structure that can withstand relatively high pressures. This can be detrimental for applications where the cost and/or the weight of the heat pipe is a concern or a constraint. Applicants have come to appreciate that another potential disadvantage for both high pressure and low pressure working fluids in heat pipes, including those used in electronics that have high heat output in a small area that must be removed very rapidly, is that the heat transfer efficiency in such systems is desirably as low as possible in such systems in order to deliver the necessary level of cooling in the smallest possible area. Preferred embodiments of the present invention overcome one or more disadvantages associated with prior heat pipes and/or produce unexpected advantages, including those mentioned above, as explained below.

SUMMARY

The present invention includes methods of transferring heat in a heat pipe comprising:
(a) providing a heat pipe having evaporator section and a condenser section with a gaseous heat transfer composition in the condenser section, said gaseous heat transfer composition in the condenser section having a percent by volume of total non-condensable gases (NCG) of not greater than 1% and more preferably not greater than 0.75%, and even more preferably not greater than 0.5%; and
(b) transferring heat from said heat pipe by condensing said gaseous heat transfer composition in said condenser section.

For the purpose of convenience, heat transfer methods according to this paragraph are referred to herein as Heat Transfer Method 1.

Notwithstanding that AHRI has suggested that a NCG concentration of 1.5% by volume is acceptable for heat pipes, applicants have surprisingly found that significant and unexpected important advantages can be achieved, especially for heat pipes used for cooling of electronic devices and components, by restricting the level of NCG to less than 1% by volume, including as described in the various embodiments described herein.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section having a percent by volume of total non-condensable gases (NCG) of from about 0.2% to less than 1% and more preferably from about 0.2% to less than 0.75%, and even more preferably from about 0.2% to less than 0.5%;
(b) transferring heat from said heat pipe by condensing said gaseous heat transfer composition in said condenser section.

For the purpose of convenience, heat transfer methods according to this paragraph are referred to herein as Heat Transfer Method 2.

Applicants have also surprisingly found that for many heat pipe applications for which the cost of the working fluid is an important consideration, which it is for many important applications, there is an unexpected advantage in limiting the low end of the NCG concentration range to 0.2 volume %. As revealed hereinafter, applicants have unexpectedly found that, while it can be costly to produce a heat transfer working fluid with NCGs below 0.2%, there is not necessarily an improvement in heat transfer performance for the heat pipe that can justify this increased cost.

The present invention also includes methods of transferring heat in a heat pipe comprising:
(a) providing a heat pipe having evaporator section and a condenser section with a low pressure gaseous heat transfer composition in the condenser section, said gaseous heat transfer composition in the condenser section comprising a low pressure working fluid having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 3.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section being selected from the group consisting of R1224yd, R1233zd(E), R1336mzz(Z), R1336mzz(E), R1234ze(Z), iso-pentane, HFE-7100, HFE-7000, HFE-649 and combinations of these, wherein said heat transfer composition has a percent by volume of total non-condensable gases (NCG) from about 0.2% to about 8% by volume(b) transferring heat from said heat pipe by condensing said gaseous heat transfer composition in said condenser section.

For the purpose of convenience, heat transfer methods according to this paragraph are referred to herein as Heat Transfer Method 4.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising cisR1224yd, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4A.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising transR1233zd, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4B.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising cisR1336mzz, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4C.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising transR1336mzz, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4D.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising R1234yf, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4E.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising cisR1234ze, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4F.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising iso-pentane, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4G.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising HFE-7100, wherein said heat transfer composition has a percent by volume of total non-condensable gases (NCG) from about 0.2% to about 8% by volume; and
(b) transferring heat from said heat pipe by condensing said gaseous heat transfer composition in said condenser section.

For the purpose of convenience, heat transfer methods according to this paragraph are referred to herein as Heat Transfer Method 4H.

The present invention also includes methods of transferring heat in a heat pipe comprising:
(a) providing a heat pipe having evaporator section and a condenser section with a gaseous heat transfer composition in the condenser section, said gaseous heat transfer composition in the condenser section comprising HFE-7000, wherein said heat transfer composition has a percent by volume of total non-condensable gases (NCG) from about 0.2% to about 8% by volume; and (b) transferring heat from said heat pipe by condensing said gaseous heat transfer composition in said condenser section.

For the purpose of convenience, heat transfer methods according to this paragraph are referred to herein as Heat Transfer Method 4I.

The present invention also includes methods of transferring heat in a heat pipe comprising:

(a) providing a heat pipe having evaporator section and a condenser section with a gaseous heat transfer composition in the condenser section, said gaseous heat transfer composition in the condenser section comprising HFE-649, wherein said heat transfer composition has a percent by volume of total non-condensable gases (NCG) from about 0.2% to about 8% by volume; and (b) transferring heat from said heat pipe by condensing said gaseous heat transfer composition in said condenser section.

For the purpose of convenience, heat transfer methods according to this paragraph are referred to herein as Heat Transfer Method 4J.

The present invention also includes methods of transferring heat in a low pressure heat pipe comprising:

(a) providing a heat pipe having evaporator section and a condenser section with a low pressure gaseous heat transfer composition in the condenser section, said gaseous heat transfer composition in the condenser section selected from the group consisting of R1233zd (E), isopentane, R1336mzz(Z), HFE-7100, HFE-7000 and HFE-649, and combinations of these, wherein said heat transfer composition has a percent by volume of total non-condensable gases (NCG) from about 0.2% to about 8% by volume; and (b) transferring heat from said heat pipe by condensing said gaseous heat transfer composition in said condenser section.

For the purpose of convenience, heat transfer methods according to this paragraph are referred to herein as Heat Transfer Method 5.

The present invention also includes methods of transferring heat in a heat pipe comprising:

(a) providing a heat pipe having:
(i) an evaporator section containing a liquid working fluid comprising at least about 60% by weight of R1233zd; and
(ii) a condenser section with a gaseous heat transfer composition in the condenser section, said gaseous heat transfer composition in the condenser section comprising at least about 60% by weight of R-1233zd and having a percent by volume of total non-condensable gases (NCG) of not greater than 1% and more preferably not greater than 0.75%, and even more preferably not greater than 0.5%; and (b) transferring heat from said heat pipe by condensing said gaseous heat transfer composition in said condenser section.

For the purpose of convenience, heat transfer methods according to this paragraph are referred to herein as Heat Transfer Method 6A.

The present invention also includes methods of transferring heat in a heat pipe comprising:

(a) providing a heat pipe having:
(i) an evaporator section containing a liquid working fluid consisting essentially of or consisting of R1233zd; and
(ii) a condenser section with a gaseous heat transfer composition in the condenser section, said gaseous heat transfer composition in the condenser section consisting essentially of R1233zd and having a percent by volume of total non-condensable gases (NCG) of not greater than 1% and more preferably not greater than 0.75%, and even more preferably not greater than 0.5%; and (b) transferring heat from said heat pipe by condensing said gaseous heat transfer composition in said condenser section.

For the purpose of convenience, heat transfer methods according to this paragraph are referred to herein as Heat Transfer Method 6B.

The present invention also includes methods of transferring heat in a heat pipe comprising:

(a) providing a heat pipe having:
(i) an evaporator section containing a liquid working fluid consisting of R1233zd; and
(ii) a condenser section with a gaseous heat transfer composition in the condenser section, said gaseous heat transfer composition in the condenser section consisting of R1233zd and having a percent by volume of total non-condensable gases (NCG) of not greater than 1% and more preferably not greater than 0.75%, and even more preferably not greater than 0.5%; and (b) transferring heat from said heat pipe by condensing said gaseous heat transfer composition in said condenser section.

For the purpose of convenience, heat transfer methods according to this paragraph are referred to herein as Heat Transfer Method 6C.

The present invention also includes methods of transferring heat in a heat pipe comprising:

(a) providing a heat pipe having:
(i) an evaporator section containing a liquid working fluid comprising at least about 60% by weight of R1233zd(E); and
(ii) a condenser section with a gaseous heat transfer composition in the condenser section, said gaseous heat transfer composition in the condenser section comprising at least about 60% by weight of R1233zd (E) and having a percent by volume of total non-condensable gases (NCG) of not greater than 1% and more preferably not greater than 0.75%, and even more preferably not greater than 0.5%; and (b) transferring heat from said heat pipe by condensing said gaseous heat transfer composition in said condenser section.

For the purpose of convenience, heat transfer methods according to this paragraph are referred to herein as Heat Transfer Method 7A.

The present invention also includes methods of transferring heat in a heat pipe comprising:

(a) providing a heat pipe having:
(i) an evaporator section containing a liquid working fluid consisting essentially of R1233zd(E); and
(ii) a condenser section with a gaseous heat transfer composition in the condenser section, said gaseous heat transfer composition in the condenser section consisting essentially of R1233zd(E) and having a percent by volume of total non-condensable gases (NCG) of not greater than 1% and more preferably not greater than 0.75%, and even more preferably not greater than 0.5%; and (b) transferring heat from said heat pipe by condensing said gaseous heat transfer composition in said condenser section.

For the purpose of convenience, heat transfer methods according to this paragraph are referred to herein as Heat Transfer Method 7B.

The present invention also includes methods of transferring heat in a heat pipe comprising:
(a) providing a heat pipe having:
  (i) an evaporator section containing a liquid working fluid consisting of R1233zd(E); and
  (ii) a condenser section with a gaseous heat transfer composition in the condenser section, said gaseous heat transfer composition in the condenser section consisting of R1233zd(E) and having a percent by volume of total non-condensable gases (NCG) of not greater than 1% and more preferably not greater than 0.75%, and even more preferably not greater than 0.5%; and
(b) transferring heat from said heat pipe by condensing said gaseous heat transfer composition in said condenser section.

For the purpose of convenience, heat transfer methods according to this paragraph are referred to herein as Heat Transfer Method 7C.

The present invention also includes methods of transferring heat in a heat pipe comprising:
(a) providing a heat pipe having:
  (i) an evaporator section containing a liquid working fluid comprising at least about 60% by weight of R1233zd; and
  (ii) a condenser section with a gaseous heat transfer composition in the condenser section, said gaseous heat transfer composition in the condenser section comprising at least about 60% by weight of R1233zd and having a percent by volume of total non-condensable gases (NCG) of having a percent by volume of total non-condensable gases (NCG) of from about 0.2% to less than 1% and more preferably from about 0.2% to less than 0.75%, and even more preferably from about 0.2% to less than than 0.5%; and
(b) transferring heat from said heat pipe by condensing said gaseous heat transfer composition in said condenser section.

For the purpose of convenience, heat transfer methods according to this paragraph are referred to herein as Heat Transfer Method 8A.

The present invention also includes methods of transferring heat in a heat pipe comprising:
(a) providing a heat pipe having:
  (i) an evaporator section containing a liquid working fluid consisting essentially of R1233zd; and
  (ii) a condenser section with a gaseous heat transfer composition in the condenser section, said gaseous heat transfer composition in the condenser section consisting essentially of R1233zd and having a percent by volume of total non-condensable gases (NCG) of having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 8B.

The present invention also includes methods of transferring heat in a heat pipe comprising:
(a) providing a heat pipe having:
  (i) an evaporator section containing a liquid working fluid consisting of R1233zd; and
  (ii) a condenser section with a gaseous heat transfer composition in the condenser section, said gaseous heat transfer composition in the condenser section consisting of R1233zd and having a percent by volume of total non-condensable gases (NCG) of having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 8C.

The present invention also includes methods of transferring heat in a heat pipe comprising:
(a) providing a heat pipe having:
  (i) an evaporator section containing a liquid working fluid comprising at least about 60% by weight of R1233zd(E); and
  (ii) a condenser section with a gaseous heat transfer composition in the condenser section, said gaseous heat transfer composition in the condenser section comprising at least about 60% by weight of R1233zd(E) and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 9A.

The present invention also includes methods of transferring heat in a heat pipe comprising:
(a) providing a heat pipe having:
  (i) an evaporator section containing a liquid working fluid consisting essentially of R1233zd(E); and
  (ii) a condenser section with a gaseous heat transfer composition in the condenser section, said gaseous heat transfer composition in the condenser section consisting essentially of R1233zd(E) and having a percent by volume of total non-condensable gases (NCG) of from about 0.2% to less than 1% and more preferably from about 0.2% to less than 0.75%, and even more preferably from about 0.2% to less than than 0.5%; and
(b) transferring heat from said heat pipe by condensing said gaseous heat transfer composition in said condenser section.

For the purpose of convenience, heat transfer methods according to this paragraph are referred to herein as Heat Transfer Method 9B.

The present invention also includes methods of transferring heat in a heat pipe comprising:
(a) providing a heat pipe having:
  (i) an evaporator section containing a liquid working fluid consisting of R1233zd(E); and
  (ii) a condenser section with a gaseous heat transfer composition in the condenser section, said gaseous heat transfer composition in the condenser section consisting of R1233zd(E) and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 9C.

The present invention also includes methods of transferring heat in a heat pipe comprising:
(a) providing a heat pipe having:
  (i) an evaporator section containing a liquid working fluid comprising at least about 60% by weight of R1234ze; and
  (ii) a condenser section with a gaseous heat transfer composition in the condenser section, said gaseous heat transfer composition in the condenser section comprising at least about 60% by weight of R1234ze and having a percent by volume of total non-condensable gases (NCG) of not greater than 1% and more preferably not greater than 0.75%, and even more preferably not greater than 0.5%%; and
(b) transferring heat from said heat pipe by condensing said gaseous heat transfer composition in said condenser section.

For the purpose of convenience, heat transfer methods according to this paragraph are referred to herein as Heat Transfer Method 10A.

The present invention also includes methods of transferring heat in a heat pipe comprising:
(a) providing a heat pipe having:
  (i) an evaporator section containing a liquid working fluid consisting essentially of R1234ze; and
  (ii) a condenser section with a gaseous heat transfer composition in the condenser section, said gaseous heat transfer composition in the condenser section consisting essentially of R1234ze and having a percent by volume of total non-condensable gases (NCG) of not greater than 1% and more preferably not greater than 0.75%, and even more preferably not greater than 0.5%%; and
(b) transferring heat from said heat pipe by condensing said gaseous heat transfer composition in said condenser section.

For the purpose of convenience, heat transfer methods according to this paragraph are referred to herein as Heat Transfer Method 10B.

The present invention also includes methods of transferring heat in a heat pipe comprising:
(a) providing a heat pipe having:
  (i) an evaporator section containing a liquid working fluid consisting of R1234ze; and
  (ii) a condenser section with a gaseous heat transfer composition in the condenser section, said gaseous heat transfer composition in the condenser section consisting of R1234ze and having a percent by volume of total non-condensable gases (NCG) of not greater than 1% and more preferably not greater than 0.75%, and even more preferably not greater than 0.5%%; and
(b) transferring heat from said heat pipe by condensing said gaseous heat transfer composition in said condenser section.

For the purpose of convenience, heat transfer methods according to this paragraph are referred to herein as Heat Transfer Method 10C.

The present invention also includes methods of transferring heat in a heat pipe comprising:
(a) providing a heat pipe having:
  (i) an evaporator section containing a liquid working fluid comprising at least about 60% by weight of R1234ze(Z); and
  (ii) a condenser section with a gaseous heat transfer composition in the condenser section, said gaseous heat transfer composition in the condenser section comprising at least about 60% by weight of R1234ze(Z) and having a percent by volume of total non-condensable gases (NCG) of not greater than 1% and more preferably not greater than 0.75%, and even more preferably not greater than 0.5%; and
(b) transferring heat from said heat pipe by condensing said gaseous heat transfer composition in said condenser section. For the purpose of convenience, heat transfer methods according to this paragraph are referred to herein as Heat Transfer Method 11A.

The present invention also includes methods of transferring heat in a heat pipe comprising:
(a) providing a heat pipe having:
  (i) an evaporator section containing a liquid working fluid consisting essentially of at least about 60% by weight of R1234ze(Z); and
  (ii) a condenser section with a gaseous heat transfer composition in the condenser section, said gaseous heat transfer composition in the condenser section consisting essentially of R1234ze(Z) and having a percent by volume of total non-condensable gases (NCG) of not greater than 1% and more preferably not greater than 0.75%, and even more preferably not greater than 0.5%; and
(b) transferring heat from said heat pipe by condensing said gaseous heat transfer composition in said condenser section. For the purpose of convenience, heat transfer methods according to this paragraph are referred to herein as Heat Transfer Method 11B.

The present invention also includes methods of transferring heat in a heat pipe comprising:
(a) providing a heat pipe having:
  (i) an evaporator section containing a liquid working fluid consisting of at least about 60% by weight of R1234ze(Z); and
  (ii) a condenser section with a gaseous heat transfer composition in the condenser section, said gaseous heat transfer composition in the condenser section consisting of R1234ze(Z) and having a percent by volume of total non-condensable gases (NCG) of not greater than 1% and more preferably not greater than 0.75%, and even more preferably not greater than 0.5%; and
(b) transferring heat from said heat pipe by condensing said gaseous heat transfer composition in said condenser section. For the purpose of convenience, heat transfer methods according to this paragraph are referred to herein as Heat Transfer Method 11C.

The present invention also includes methods of transferring heat in a heat pipe comprising:
(a) providing a heat pipe having:
(i) an evaporator section containing a liquid working fluid comprising at least about 60% by weight of R1234ze; and
(ii) a condenser section with a gaseous heat transfer composition in the condenser section, said gaseous heat transfer composition in the condenser section comprising at least about 60% by weight of R1234ze and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 12A.

The present invention also includes methods of transferring heat in a heat pipe comprising:
(a) providing a heat pipe having:
(i) an evaporator section containing a liquid working fluid consisting essentially of R1234ze; and
(ii) a condenser section with a gaseous heat transfer composition in the condenser section, said gaseous heat transfer composition in the condenser section consisting essentially of R1234ze and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 12B.

The present invention also includes methods of transferring heat in a heat pipe comprising:
(a) providing a heat pipe having:
(i) an evaporator section containing a liquid working fluid consisting of R1234ze; and
(ii) a condenser section with a gaseous heat transfer composition in the condenser section, said gaseous heat transfer composition in the condenser section consisting of R1234ze and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section.

For the purpose of convenience, heat transfer methods according to this paragraph are referred to herein as Heat Transfer Method 12C.

The present invention also includes methods of transferring heat in a heat pipe comprising:
(a) providing a heat pipe having:
(i) an evaporator section containing a liquid working fluid comprising at least about 60% by weight of R1234ze(Z); and
(ii) a condenser section with a gaseous heat transfer composition in the condenser section, said gaseous heat transfer composition in the condenser section comprising at least about 60% by weight of R1234ze(Z) and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section. For the purpose of convenience, heat transfer methods according to this paragraph are referred to herein as Heat Transfer Method 13A.

The present invention also includes methods of transferring heat in a heat pipe comprising:
(a) providing a heat pipe having:
(i) an evaporator section containing a liquid working fluid consisting essentially of at least about 60% by weight of R1234ze(Z); and
(ii) a condenser section with a gaseous heat transfer composition in the condenser section, said gaseous heat transfer composition in the condenser section consisting essentially of R1234ze(Z) and having a percent by volume of total non-condensable gases (NCG) of from about 0.2% to less than 1% and more preferably from about 0.2% to less than 0.75%, and even more preferably from about 0.2% to less than 0.5%; and
(b) transferring heat from said heat pipe by condensing said gaseous heat transfer composition in said condenser section. For the purpose of convenience, heat transfer methods according to this paragraph are referred to herein as Heat Transfer Method 13C.

The present invention includes heat pipes comprising an evaporator section and a condenser section with a gaseous heat transfer composition in the condenser section, said gaseous heat transfer composition in the condenser section having a percent by volume of total non-condensable gases (NCG) of not greater than 1% and more preferably not greater than 0.75%, and even more preferably not greater than 0.5%.

For the purpose of convenience, heat pipes according to this paragraph are referred to herein as Heat Pipe 1.

The present invention also heat pipes comprising an evaporator section and a condenser section with a gaseous heat transfer composition in the condenser section, said gaseous heat transfer composition in the condenser section having a percent by volume of total non-condensable gases (NCG) of from about 0.2% to less than 1% and more preferably from about 0.2% to less than 0.75%, and even more preferably from about 0.2% to less than 0.5%.

For the purpose of convenience, heat pipes according to this paragraph are referred to herein as Heat Pipe 2.

The present invention also includes heat pipes comprising an evaporator section and a condenser section with a low pressure gaseous heat transfer composition in the condenser section, said gaseous heat transfer composition in the condenser section comprising a low pressure working fluid having a percent by volume of total non-condensable gases (NCG) of from about 0.2% to less than 1% and more preferably from about 0.2% to less than 0.75%, and even more preferably from about 0.2% to less than 0.5%

For the purpose of convenience, heat pipes according to this paragraph are referred to herein as Heat Pipe 3.

The present invention also includes heat pipes comprising an evaporator section and a condenser section with a gaseous heat transfer composition in the condenser section, said gaseous heat transfer composition in the condenser section being selected from the group consisting of R1224yd, R1233zd(E), R1336mzz(Z), R1336mzz(E), R1234ze(Z), iso-pentane, HFE-7100, HFE-7000, HFE-649 and combinations of these, wherein said heat transfer composition has a percent by volume of total non-condensable gases (NCG) from about 0.2% to about 8% by volume.

For the purpose of convenience, heat pipes according to this paragraph are referred to herein as Heat Pipe 4.

The present invention also includes heat pipes comprising an evaporator section and a condenser section with a gaseous heat transfer composition in the condenser section, said gaseous heat transfer composition in the condenser section comprising cisR1224yd, wherein said heat transfer composition has a percent by volume of total non-condensable gases (NCG) from about 0.2% to about 8% by volume.

For the purpose of convenience, heat pipes according to this paragraph are referred to herein as Heat Transfer Method 4A.

The present invention also heat pipes having evaporator section and a condenser section with a gaseous heat transfer composition in the condenser section, said gaseous heat transfer composition in the condenser section comprising transR1233zd, wherein said heat transfer composition has a percent by volume of total non-condensable gases (NCG) from about 0.2% to about 8% by volume.

For the purpose of convenience, heat pipes according to this paragraph are referred to herein as Heat Pipe 4B.

The present invention also includes heat pipes comprising an evaporator section and a condenser section with a gaseous heat transfer composition in the condenser section, said gaseous heat transfer composition in the condenser section comprising cisR1336mzz, wherein said heat transfer composition has a percent by volume of total non-condensable gases (NCG) from about 0.2% to about 8% by volume.

For the purpose of convenience, heat pipes according to this paragraph are referred to herein as Heat Pipe 4C.

The present invention also includes heat pipes comprising an evaporator section and a condenser section with a gaseous heat transfer composition in the condenser section, said gaseous heat transfer composition in the condenser section comprising transR1336mzz, wherein said heat transfer composition has a percent by volume of total non-condensable gases (NCG) from about 0.2% to about 8% by volume.

For the purpose of convenience, heat pipes according to this paragraph are referred to herein as Heat Pipe 4D.

The present invention also includes heat pipes comprising an evaporator section and a condenser section with a gaseous heat transfer composition in the condenser section, said gaseous heat transfer composition in the condenser section comprising R1234yf, wherein said heat transfer composition has a percent by volume of total non-condensable gases (NCG) from about 0.2% to about 8% by volume.

For the purpose of convenience, heat pipes according to this paragraph are referred to herein as Heat Pipe 4E.

The present invention also includes heat pipes comprising an evaporator section and a condenser section with a gaseous heat transfer composition in the condenser section, said gaseous heat transfer composition in the condenser section comprising cisR1234ze, wherein said heat transfer composition has a percent by volume of total non-condensable gas (NCG) from about 0.2% to about 8% by volume For the purpose of convenience, heat pipes according to this paragraph are referred to herein as Heat Pipe 4F.

The present invention also includes heat pipes comprising an evaporator section and a condenser section with a gaseous heat transfer composition in the condenser section, said gaseous heat transfer composition in the condenser section comprising iso-pentane, wherein said heat transfer composition has a percent by volume of total non-condensable gases (NCG) from about 0.2% to about 8% by volume.

For the purpose of convenience, heat pipes according to this paragraph are referred to herein as Heat Pipe 4G.

The present invention also includes heat pipes comprising an evaporator section and a condenser section with a gaseous heat transfer composition in the condenser section, said gaseous heat transfer composition in the condenser section comprising HFE-7100, wherein said heat transfer composition has a percent by volume of total non-condensable gases (NCG) from about 0.2% to about 8% by volume.

For the purpose of convenience, heat pipes according to this paragraph are referred to herein as Heat Pipe 4H.

The present invention also includes heat pipes comprising an evaporator section and a condenser section with a gaseous heat transfer composition in the condenser section, said gaseous heat transfer composition in the condenser section comprising HFE-7000, wherein said heat transfer composition has a percent by volume of total non-condensable gases (NCG) from about 0.2% to about 8% by volume.

For the purpose of convenience, heat pipes according to this paragraph are referred to herein as Heat Pipe 4I.

The present invention also includes heat pipes comprising an evaporator section and a condenser section with a gaseous heat transfer composition in the condenser section, said gaseous heat transfer composition in the condenser section comprising HFE-649, wherein said heat transfer composition has a percent by volume of total non-condensable gases (NCG) from about 0.2% to about 8% by volume.

For the purpose of convenience, heat transfer methods according to this paragraph are referred to herein as Heat Transfer Method 4J.

DEFINITIONS

Figure 1:
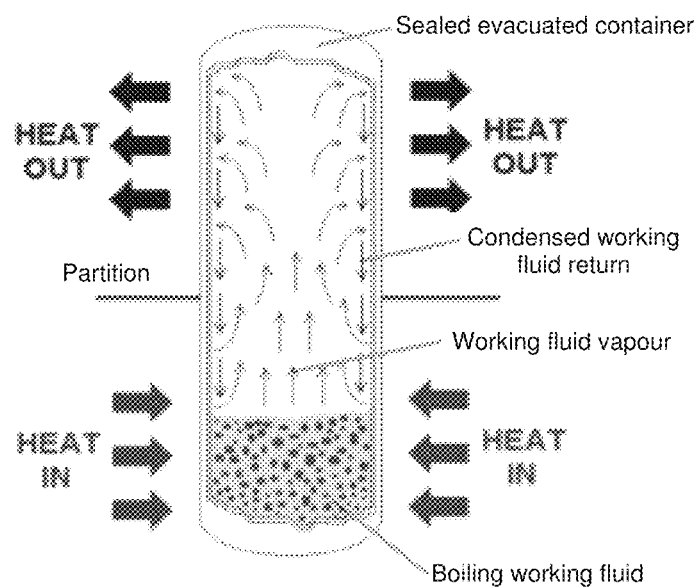
FIG. 1 is a schematic representation of a gravity-return heat pipe.
Figure 2:
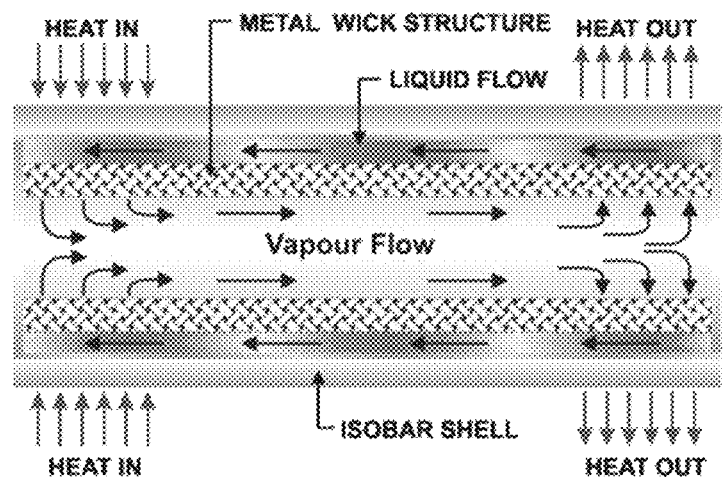
FIG. 2 is a schematic representation of a capillary-return heat pipe.

As used herein, the term "R1233zd" means 1-chloro-3,3,3-trifluoropropene and includes 100% of the cis isomer, 100% of the trans isomer and all combinations of the cis and trans isomer.

The terms "R1233zd(E)" and "transR-1233zd" each mean the trans isomer of 1-chloro-3,3,3-trifluoropropene.

The terms "R-1224yd(Z)" and cisR-1224yd each mean the cis isomer of 1-chloro-2,3,3,3-tetrafluoropropene.

As used herein, the term "R1234ze" means 1,3,3,3-tetrafluoropropene and includes the 100% of the cis isomer, 100% of the trans isomer and all combinations of the cis and trans isomer.

The terms "R-1234ze(E)" and transR-1234ze each mean the trans isomer of 1,3,3,3-tetrafluoropropene.

The term "R-1234yf" means 2,3,3,3-tetrafluoropropene.

The terms "R-1336mzz(E)" and transR-1336mzz each mean the trans isomer of 1,1,1,4,4,4-hexafluorobut-2-ene.

The terms "R-1336mzz(Z)" and cisR-1336mzz each mean the cis isomer of 1,1,1,4,4,4-hexafluorobut-2-ene.

The term "HFE-7100" means a mixture of methyl nonafluorobutyl ether and methyl nonafluoroisobutyl ether, including the product sold by 3M under the trade designation Novec 7100.

The term "HFE-7000" means 1-methoxyheptafluoropropane including the product sold by 3M under the trade designation Novec 7000.

HFE-649 means 1,1,1,2,2,4,5,5,5-nonafluoro-4-(trifluoromethyl)-3-pentanone including the product sold by 3M under the trade designation Novec 649.

As the term is used herein, "heat sink" means the body, fluid, surface or the like which is able to receive the heat transferred from the condenser section of the heat pipe.

As used herein, the term "thermal communication" between a first body, fluid, surface or the like and a second body, fluid, surface or the like means that the first body and the second body are separated, if at all, only by thermally conductive materials so as to permit ready transfer of heat from the first body to the second body, as is well understood by those skilled in the art.

As used herein, the term "operating temperature range" refers to a temperature range that encompasses the temperature of the working fluid in the evaporating section. Thus, for example, a heat pipe operates with a working fluid at a temperature of 25° C. is operating according to an operating temperature range that is defined as "equal to or greater than 20° C."

As the term is used herein, "gravity-return heat pipe" means a heat pipe in which the liquid working fluid returns to the evaporator section from the condenser section, at least in part and preferably in substantial part, by the action of gravity-return on the working fluid.

As the term is used herein, "capillary-return heat pipe" means a heat pipe in which the liquid working fluid returns to the evaporator section from the condenser section, at least in part and preferably in substantial part, by capillary action on the working fluid. In preferred embodiments, the capillary action is provided by a wicking structure located along a portion of the inner wall of the heat pipe, preferably at least between the evaporator section and the condenser section.

As used herein, reference to a group of defined heat transfer methods, compositions, heat pipes, etc means each and every one included within the defined group. Thus, for example, reference to "each of Heat Transfer Method 1 through Heat Transfer Method 13" includes each defined member, including all numbered Heat Transfer Methods having a letter designation following the number, such as Heat Transfer Method 4A, 4B, etc.

As used herein, the term "heat pipe temperature differential" means the difference between the working fluid temperature in the evaporator section and the condenser section of the heat pipe.

DETAILED DESCRIPTION

Applicants have unexpectedly found that the needs and advantages mentioned above, among others, can be achieved and/or that the heat pipe operating effectiveness can be unexpectedly improved, according to the methods, systems, uses, articles and compositions of the present invention.

Methods

The present methods, including each of Heat Transfer Method 1 through Heat Transfer Method 13, comprise transferring heat from a body or fluid to be cooled to a heat sink wherein said evaporating section is in thermal communication with the body or fluid to be cooled and the condensing section is in thermal communication with the heat sink.

The present methods, including each of Heat Transfer Method 1 through Heat Transfer Method 13, comprise operating said heat pipe wherein the operating temperature range of the heat pipe is 20° C. and higher. For the purpose of convenience, heat transfer methods according to this paragraph are referred to herein as Heat Transfer Method 14A.

The present methods, including each of Heat Transfer Method 1 through Heat Transfer Method 13, comprise operating said heat pipe wherein the operating temperature range of the heat pipe is from about 20° C. to about 100° C. For the purpose of convenience, heat transfer methods according to this paragraph are referred to herein as Heat Transfer Method 14B.

The present methods, including each of Heat Transfer Method 1 through Heat Transfer Method 13, comprise operating said heat pipe wherein the heat pipe is a gravity-return heat pipe and/or a capillary-return heat pipe and the operating temperature range of the heat pipe is from about 20° C. to about 100° C. For the purpose of convenience, heat transfer methods according to this paragraph are referred to herein as Heat Transfer Method 14C.

The present methods, including each of Heat Transfer Method 1 through Heat Transfer Method 13, comprise operating said heat pipe wherein the heat pipe is a gravity-return heat pipe and/or a capillary-return heat pipe and the operating temperature range of the heat pipe is from about 50° C. to about 100° C. For the purpose of convenience, heat transfer methods according to this paragraph are referred to herein as Heat Transfer Method 14D.

The present methods, including each of Heat Transfer Method 1 through Heat Transfer Method 13, comprise operating said heat pipe wherein the heat pipe is a gravity-return heat pipe and/or a capillary-return heat pipe and the operating temperature range of the heat pipe is from about 70° C. to about 100° C. For the purpose of convenience, heat transfer methods according to this paragraph are referred to herein as Heat Transfer Method 14E.

The present methods, including each of Heat Transfer Method 1 through Heat Transfer Method 13, comprise operating said heat pipe wherein the heat pipe is a gravity-return heat pipe and/or a capillary-return heat pipe and the operating temperature range of the heat pipe is from about 85° C. to about 95° C. For the purpose of convenience, heat transfer methods according to this paragraph are referred to herein as Heat Transfer Method 14F.

The present methods, including each of Heat Transfer Method 1 through Heat Transfer Method 13, include methods wherein the heat pipe is a gravity-return heat pipe and/or a capillary-return heat pipe, and the operating temperature range of the heat pipe is from about 85° C. to about 95° C. For the purpose of convenience, heat transfer methods according to this paragraph are referred to herein as Heat Transfer Method 14G.

The present methods, including each of Heat Transfer Method 1 through Heat Transfer Method 13, include methods wherein the heat pipe is a gravity-return heat pipe and/or a capillary-return heat pipe, and the operating temperature range of the heat pipe is greater than about 85° C. For the purpose of convenience, heat transfer methods according to this paragraph are referred to herein as Heat Transfer Method 14H.

The present methods, including each of Heat Transfer Method 1 through Heat Transfer Method 13, include methods wherein the heat pipe is a gravity-return heat pipe and/or a capillary-return heat pipe and the operating temperature range of the heat pipe is greater than about 88° C. For the purpose of convenience, heat transfer methods according to this paragraph are referred to herein as Heat Transfer Method 14I.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 50° C. to about 100° C. and wherein said heat sink is at a temperature of from about 15° C. to about 80° C. For the purpose of convenience, heat transfer methods according to this paragraph are referred to herein as Heat Transfer Method 15A.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 50° C. to about 100° C. and wherein said heat sink is at a temperature of from about 15° C. to about 40° C. For the purpose of convenience, heat transfer methods according to this paragraph are referred to herein as Heat Transfer Method 15B.

The present methods, including each of Heat Transfer Method 1 through Heat Transfer Method 13, comprise operating said heat pipe wherein the operating temperature range of the heat pipe is from about 50° C. to about 100° C. and wherein said heat sink is at a temperature of from about 20° C. to about 30° C. For the purpose of convenience, heat transfer methods according to this paragraph are referred to herein as Heat Transfer Method 15C.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 70° C. to about 100° C. and wherein said heat sink is at a temperature of from about 15° C. to about 80° C. For the purpose of convenience, heat transfer methods according to this paragraph are referred to herein as Heat Transfer Method 15D.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 70° C. to about 100° C. and wherein said heat sink is at a temperature of from about 15° C. to about 40° C. For the purpose of convenience, heat transfer methods according to this paragraph are referred to herein as Heat Transfer Method 15E.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 70° C. to about 100° C. and wherein said heat sink is at a temperature of from about 20° C. to about 30° C. For the purpose of convenience, heat transfer methods according to this paragraph are referred to herein as Heat Transfer Method 15F.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 85° C. to about 100° C. and wherein said heat sink is at a temperature of from about 15° C. to about 80° C. For the purpose of convenience, heat transfer methods according to this paragraph are referred to herein as Heat Transfer Method 15G.

The present methods, including each of Heat Transfer Method 1 through Heat Transfer Method 13, comprise operating said heat pipe wherein the heat pipe is a gravity-return heat pipe and/or a capillary-return heat pipe, the operating temperature range of the heat pipe is from about 85° C. to about 100° C. and wherein said heat sink is at a temperature of from about 15° C. to about 40° C. For the purpose of convenience, heat transfer methods according to this paragraph are referred to herein as Heat Transfer Method 15H.

The present methods, including each of Heat Transfer Method 1 through Heat Transfer Method 13, include methods wherein the heat pipe is a gravity-return heat pipe and/or a capillary-return heat pipe, the operating temperature range of the heat pipe is from about 85° C. to about 100° C. and wherein said heat sink is at a temperature of from about 20° C. to about 30° C. For the purpose of convenience, heat transfer methods according to this paragraph are referred to herein as Heat Transfer Method 15I.

The present methods, including each of Heat Transfer Method 1 through Heat Transfer Method 13, include methods wherein the heat pipe is a gravity-return heat pipe and/or a capillary-return heat pipe, the operating temperature range of the heat pipe is from about 85° C. to about 95° C. and wherein said heat sink is at a temperature of from about 15° C. to about 80° C. For the purpose of convenience, heat transfer methods according to this paragraph are referred to herein as Heat Transfer Method 15J.

The present methods, including each of Heat Transfer Method 1 through Heat Transfer Method 13, include methods wherein the heat pipe is a gravity-return heat pipe and/or a capillary-return heat pipe, the operating temperature range of the heat pipe is from about 85° C. to about 95° C. and wherein said heat sink is at a temperature of from about 15° C. to about 40° C. For the purpose of convenience, heat transfer methods according to this paragraph are referred to herein as Heat Transfer Method 15K.

The present methods, including each of Heat Transfer Method 1 through Heat Transfer Method 13, include methods wherein the heat pipe is a gravity-return heat pipe and/or a capillary-return heat pipe, the operating temperature range of the heat pipe is from about 85° C. to about 95° C. and wherein said heat sink is at a temperature of from about 20° C. to about 30° C. For the purpose of convenience, heat transfer methods according to this paragraph are referred to herein as Heat Transfer Method 15L.

The present methods, including each of Heat Transfer Method 1 through Heat Transfer Method 13, include methods wherein the heat pipe is a gravity-return heat pipe and/or a capillary-return heat pipe, the operating temperature range of the heat pipe is greater than about 85° C. and wherein said heat sink is at a temperature of from about 15° C. to about 80° C. For the purpose of convenience, heat transfer methods according to this paragraph are referred to herein as Heat Transfer Method 15M.

The present methods, including each of Heat Transfer Method 1 through Heat Transfer Method 13, include methods wherein the heat pipe is a gravity-return heat pipe and/or a capillary-return heat pipe, the operating temperature range of the heat pipe is greater than about 85° C. and wherein said heat sink is at a temperature of from about 15° C. to about 40° C. For the purpose of convenience, heat transfer methods according to this paragraph are referred to herein as Heat Transfer Method 15N.

The present methods, including each of Heat Transfer Method 1 through Heat Transfer Method 13, include methods wherein the heat pipe is a gravity-return heat pipe and/or a capillary-return heat pipe, the operating temperature range of the heat pipe greater than about 85° C. and wherein said heat sink is at a temperature of from about 20° C. to about 30° C. For the purpose of convenience, heat transfer methods according to this paragraph are referred to herein as Heat Transfer Method 15O.

The present methods, including each of Heat Transfer Method 1 through Heat Transfer Method 13, include methods wherein the heat pipe is a gravity-return heat pipe and/or a capillary-return heat pipe, the operating temperature range of the heat pipe is greater than about 88° C. and wherein said heat sink is at a temperature of from about 15° C. to about 80° C. For the purpose of convenience, heat transfer methods according to this paragraph are referred to herein as Heat Transfer Method 15P.

The present methods, including each of Heat Transfer Method 1 through Heat Transfer Method 13, include methods wherein the heat pipe is a gravity-return heat pipe and/or a capillary-return heat pipe, the operating temperature range of the heat pipe is greater than about 88° C. and wherein said heat sink is at a temperature of from about 15° C. to about 40° C. For the purpose of convenience, heat transfer methods according to this paragraph are referred to herein as Heat Transfer Method 15Q.

The present methods, including each of Heat Transfer Method 1 through Heat Transfer Method 13, include methods wherein: the heat pipe is a gravity-return heat pipe and/or a capillary-return heat pipe; the operating temperature range of the heat pipe greater than about 88° C.; and said heat sink is at a temperature of from about 20° C. to about 30° C. For the purpose of convenience, heat transfer methods according to this paragraph are referred to herein as Heat Transfer Method 15R.

As discussed in more detail below, applicants have found that heat pipes, electronic devices, electronic components, systems and compositions as described herein are unexpectedly able to achieve high levels of operational effectiveness and efficiency in heat pipes in general and in capillary-return and/or gravity-return heat pipes in particular in when configured to operate in accordance with the present methods, including each of Heat Transfer Method 1-Heat Transfer Methods 15.

One measure of the effectiveness of heat pipe operation, particularly for those methods and systems involving the cooling of small electronic components, is the ability to achieve the required level of cooling while maintaining a relatively small temperature differential (e.g., preferably less than 5° C., or preferably less than 4° C., or preferably less than 3° C., or preferably less than 2° C.) between the evaporator section and the condenser section of the heat pipe. Applicants have found that the methods, systems, device, components and compositions of the present invention in preferred embodiments are able to provide highly desirable and unexpectedly excellent performance with regard to one or more of these criteria.

Accordingly, the present methods, including each of Heat Transfer Method 1 through Heat Transfer Method 15, include methods wherein heat pipe temperature differential is less than 5° C. For the purpose of convenience, heat transfer methods according to this paragraph are referred to herein as Heat Transfer Method 16A.

The present methods, including each of Heat Transfer Method 1 through Heat Transfer Method 15, also include methods wherein heat pipe temperature differential is less than 4° C. For the purpose of convenience, heat transfer methods according to this paragraph are referred to herein as Heat Transfer Method 16B.

The present methods, including each of Heat Transfer Method 1 through Heat Transfer Method 15, also include methods wherein heat pipe temperature differential is less than 3° C. For the purpose of convenience, heat transfer methods according to this paragraph are referred to herein as Heat Transfer Method 16C.

The present methods, including each of Heat Transfer Method 1 through Heat Transfer Method 15, also include methods wherein heat pipe temperature differential is less than 2° C. For the purpose of convenience, heat transfer methods according to this paragraph are referred to herein as Heat Transfer Method 16D.

The present methods, including each of Heat Transfer Method 1 through Heat Transfer Method 16, wherein the heat pipe is a capillary return heat pipe, a gravity-return return heat pipe, a centripetal force return heat pipe, an oscillating heat pipe, an osmotic force return heat pipe, an electrokinetic force return heat pipe or a magnetic force return heat pipe.

The present methods, including each of Heat Transfer Method 1 through Heat Transfer Method 16, include cooling of an electric or electronic component, and particularly where the device being cooled is an electric device, an e-vehicle, a data center or a light emitting diode (LED), or a device used in the heat management of a spacecraft or in heat recovery.

Heat Pipes

The present invention includes heat pipes, including each of Heat Pipes 1-4, in the form of a gravity-return heat pipe.

The present invention includes heat pipes, including each of Heat Pipes 1-4, in the form of a capillary-return heat pipe.

The present invention includes heat pipes, including each of Heat Pipes 1-4, in the form of a combination of a capillary-return heat pipe and a gravity-return heat pipe.

The present invention includes heat pipes, including each of Heat Pipes 1-4, in the form of a rotating heat pipe.

The present invention includes heat pipes, including each of Heat Pipes 1-4, in the form of a electrohydrodynamic heat pipe.

The present invention includes heat pipes, including each of Heat Pipes 1-4, in the form of a electro-osmotic heat pipe.

The present invention includes heat pipes, including each of Heat Pipes 1-4, in the form of a magnetohydrodynamic heat pipe.

The present invention includes heat pipes, including each of Heat Pipes 1-4, in the form of a magnetic fluid heat pipe.

The present invention includes heat pipes, including each of Heat Pipes 1-4, in the form of an osmotic fluid heat pipe.

The present invention includes heat pipes, including each of Heat Pipes 1-4, in the form of an oscillating heat pipe.

The present invention includes heat pipes, including each of Heat Pipes 1-4, located in a data center.

The present invention includes heat pipes, including each of Heat Pipes 1-4, located in an air craft.

The present invention includes heat pipes, including each of Heat Pipes 1-4, located in a space craft.

The present invention includes heat pipes, including each of Heat Pipes 1-4, located in a satellite.

Uses

The present invention provides uses of the present methods, including each of Heat Transfer Methods 1-16, and uses of the present heat pipes, including each of Heat Pipes 1-4, to provide cooling of electronic equipment or components.

The present invention provides uses of the present methods, including each of Heat Transfer Methods 1-16, and uses of the present heat pipes, including each of Heat Pipes 1-4, to provide cooling of a central processing unit (CPU).

The present invention provides uses of the present methods, including each of Heat Transfer Methods 1-16, and uses of the present heat pipes, including each of Heat Pipes 1-4, to provide cooling of a light emitting diode (LED).

The present invention provides uses of the present methods, including each of Heat Transfer Methods 1-16, and uses of the present heat pipes, including each of Heat Pipes 1-4, to provide cooling of a central processing unit (CPU).

The present invention provides uses of the present methods, including each of Heat Transfer Methods 1-16, and uses of the present heat pipes, including each of Heat Pipes 1-4, to provide cooling in a data center.

The present invention provides uses of the present methods, including each of Heat Transfer Methods 1-16, and uses of the present heat pipes, including each of Heat Pipes 1-4, to provide cooling in an air craft.

The present invention provides uses of the present methods, including each of Heat Transfer Methods 1-16, and uses of the present heat pipes, including each of Heat Pipes 1-4, to provide cooling in a space craft.

The present invention provides uses of the present methods, including each of Heat Transfer Methods 1-16, and uses of the present heat pipes, including each of Heat Pipes 1-4, to provide cooling in a satellite.

The present invention provides uses of the present methods, including each of Heat Transfer Methods 1-16, and uses of the present heat pipes, including each of Heat Pipes 1-4, to provide cooling of a battery.

The present invention provides uses of the present methods, including each of Heat Transfer Methods 1-16, and uses of the present heat pipes, including each of Heat Pipes 1-4, to provide cooling of a semiconductor.

EXAMPLES

Examples

Comparative Example 1—1233zd(E) as Working Fluid in Heat Pipe with NCGs of 1% or Greater For the purposes of developing a base-line for comparative data, an aluminum, gravity return heat pipe was provided. The heat pipe was arranged vertically with a height of about 680 mm and a width of about 130 mm, with a honeycomb pattern flow channel to return liquid condensate from the condenser section (located in the top section of the heat pipe) to the evaporator section. An electric heater was located adjacent approximately ⅓ above the bottom of the heat pipe in the vertical direction and between the left and right edges of the heat pipe in the horizontal direction to simulate heat originating from a telecommunications chip, particularly a 5G chip. The heater was a 30 watt heater and had a size about 45 mm by 45 mm. The top edge of the heater was located approximately coincided with the liquid level (also referred to as the charging ratio) in the heat pipe. In actual operation of cooling a chip on a circuit board, for example, the typical charging ratio would be selected to represent from about 20% to about 40% of the heat pipe volume. For the purposes of these tests, a charging ratio of about 30% volume was selected. A first thermocouple (1/16 inch thick) was placed adjacent to the top of the evaporator section (about 20 mm above the top of the heater) and a second thermocouple was placed adjacent to the condenser section (30 mm below the top edge of the heat pipe) to monitor the temperature of the heat pipe in those sections during testing.

A series of working fluids based on 1233zd(E) with different levels of NCG were prepared and used in the heat pipe to test the thermal performance of the heat pipe with the heater operating with essentially the same power input for each working fluid under room temperature ambient conditions and without an forced air heat removal from the condenser section. The NCG level for each test was determined be gas chromatography with a thermal conductivity detector as described in Appendix C to AHRI Standard 700. The temperature of each thermocouple was measured and recorded at 1 minute after starting to heat the heat pipe, and the difference between the two thermocouples was calculated and recorded. These working fluids, in terms of the volume percentage of NCG in the vapor for each working fluid, are identified in Table C1 below, together with the test results in terms of thermal performance of the heat pipe with each working fluid, and these test results are also charted in the graph shown in FIG. 3 hereof:

TABLE C1

| NCG/% V/V | Temperature difference/° C. | Evaporator test point/° C. | Condenser test point/° C. |
| --- | --- | --- | --- |
| 1.2 | 6 | 41.4 | 35.4 |
| 1.47 | 6.2 | 39.4 | 33.2 |
| 1.48 | 5.9 | 39.3 | 33.4 |
| 1.55 | 5.6 | 36 | 30.4 |
| 1.66 | 6.6 | 36 | 29.4 |
| 1.93 | 6.5 | 37.1 | 30.6 |
| 2.42 | 7.5 | 35.7 | 28.2 |
| 2.47 | 7.4 | 33 | 25.6 |
| 2.72 | 8.5 | 35.8 | 27.3 |
| 2.95 | 9 | 38.2 | 29.2 |
| 3.2 | 8.7 | 38.3 | 29.6 |
| 3.28 | 9.3 | 39.2 | 29.9 |

Figure 3:
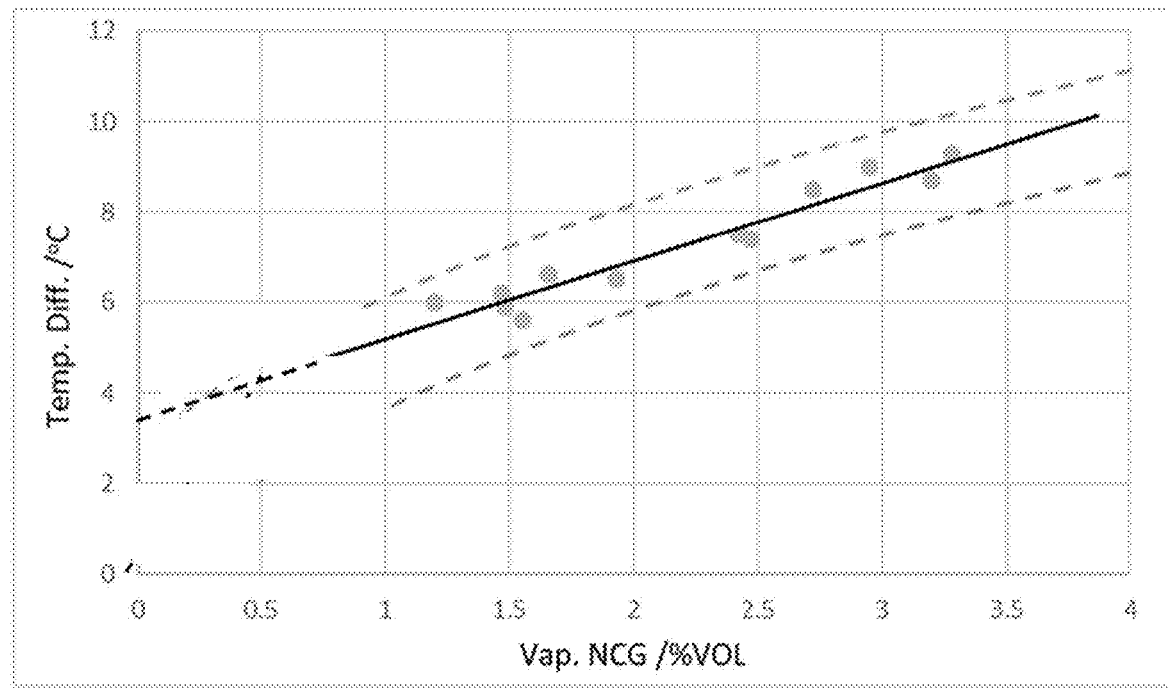
FIG. 3 is a chart of the data reported in Comparative Example 1.

As is revealed by FIG. 3, all of the results with working fluids in this test result in a temperature differential of about 6° C. or higher. Moreover, the linear trend line of the data for working fluids in this test indicate that even lowering the NCG levels to zero would produce a temperature differential for the heat pipe of about 4° C. or higher.

Example 1-1233zd(E) as Working Fluid in Heat Pipe with NCGs of Less than 1%

Applicants have unexpectedly found that preparing a working fluid for a heat pipe to ensure that the vapor NCG volume percent is less than 1%, more preferably less than 0.75% and even more preferably less than 0.5% results in a dramatically and surprisingly superior heat transfer performance compared to the trend line established by the results from values of 1.5% and higher. More particularly, Example C1 is repeated, except that 1233zd(E) working fluids, having volume percentage of NCG in the vapor less than 1% were used, and these working fluids are identified in Table 1 below, together with the test results for those working fluids in terms of thermal performance of the heat pipe with each working fluid.

TABLE 1

| NCG/% V/V | Temperature difference/° C. | Evaporator test point/° C. | Condenser test point/° C. |
|---|---|---|---|
| 0.05 | 1.9 | 33.9 | 32 |
| 0.05 | 0.7 | 33.7 | 33 |
| 0.05 | 0.7 | 35 | 34.3 |
| 0.05 | 1.2 | 37.7 | 36.5 |
| 0.05 | 1.4 | 35.6 | 34.2 |
| 0.07 | 1.2 | 35.8 | 34.6 |
| 0.08 | 1.8 | 35 | 33.2 |
| 0.08 | 0.9 | 33.7 | 32.8 |
| 0.1 | 2.1 | 37.6 | 35.5 |
| 0.1 | 0.9 | 36.25 | 35.35 |
| 0.12 | 1.6 | 33.2 | 31.6 |
| 0.19 | 2.4 | 40.1 | 37.7 |
| 0.41 | 2.6 | 34.5 | 31.9 |
| 0.43 | 3.3 | 34 | 30.7 |
| 0.78 | 4.6 | 38.9 | 34.3 |

Figure 4:
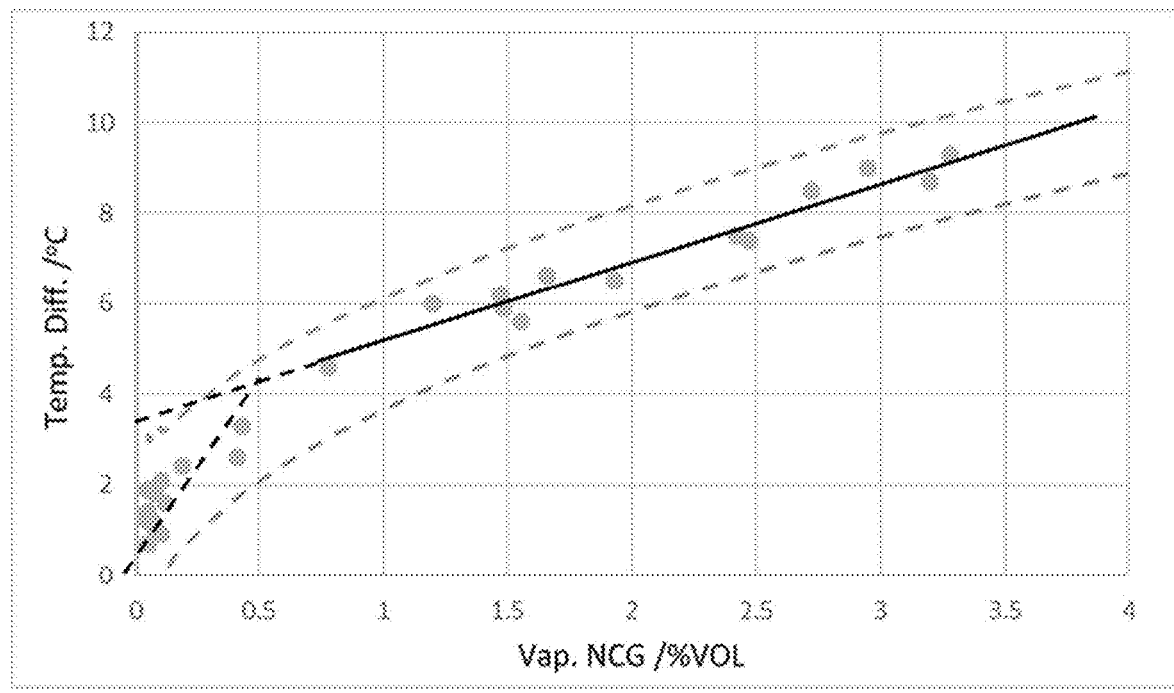
FIG. 4 is a chart of the data reported in Comparative Example 1 and in Example 1.

As can been seen from the data above, the thermal performance of the 1233zd working fluids of this example is unexpectedly improved, showing a temperature differential in all cases below about 5° C., and even more unexpectedly about 3° C. or less for NCG levels of about 0.5% by volume or less. Based on the expectations represented by the results in Comparative Example 1, such a result would not be possible even if NCG levels could be reduced to zero. This is illustrated by FIG. 4, which shows a plot of the data from Comparative Example 1 together with the data from this Example. As is shown in this chart, applicants have discovered an unexpected but highly desirable drop-off in temperature differential for working fluids of this Example, and hence a dramatically and unexpectedly improved thermal performance of the heat pipe.

Comparative Example 2-1234ze(Z) as Working Fluid in Heat Pipe with NCGs of 1% or Greater The same heat pipe was operated as described in Comparative Example 1, except that the working fluids were based on 1234ze(Z) with different levels of NCG. These working fluids, in terms of the volume percentage of NCG in the vapor for each working fluid, are identified in Table C2 below, together with the test results in terms of thermal performance of the heat pipe with each working fluid, and these test results are also charted in the graph shown in FIG. 5 hereof:

TABLE C2

| NCG/% VOL | Temp. diff./C. |
|---|---|
| 7.35 | 8.5 |
| 4.28 | 7.4 |
| 1.22 | 5.5 |
| 2.93 | 6.2 |
| 1.27 | 5.5 |

Figure 5:
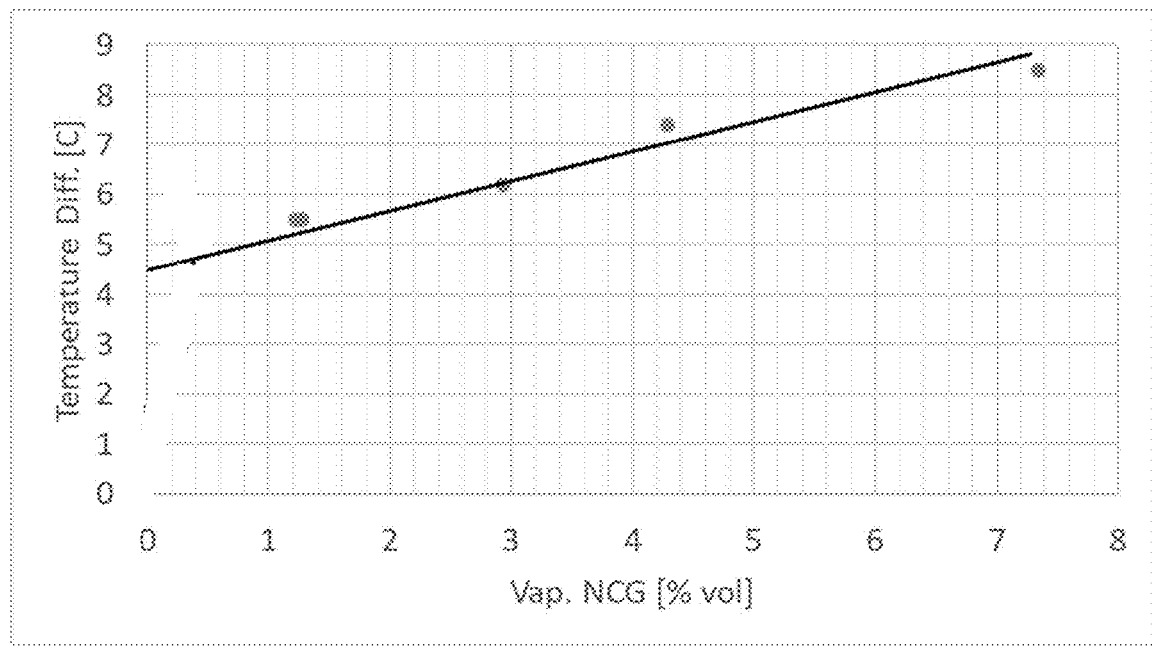
FIG. 5 is a chart of the data reported in Comparative Example 2.

As is revealed by FIG. 5, all of the results with working fluids in this test result in a temperature differential of about 5° C. or higher. Moreover, the linear trend line of the data for working fluids in this test indicate that even lowering the NCG levels to zero would produce a temperature differential for the heat pipe of greater than 4° C.

Example 2A—1234ze(Z) as Working Fluid in Heat Pipe with NCGs of Less than 1%

Applicants have unexpectedly found that preparing a working fluid for a heat pipe to ensure that the vapor NCG volume percent is less than 1%, more preferably less than 0.75% and even more preferably less than 0.5% results in a dramatically and surprisingly superior heat transfer performance compared to the trend line established by the results from values of 1% and higher. More particularly, Example C2 is repeated, except that 1234ze(Z) working fluids having volume percentage of NCG in the vapor less than 1% were used, and these working fluids are identified in Table 2 below, together with the test results for those working fluids in terms of thermal performance of the heat pipe with each working fluid.

TABLE 2

| NCG/% VOL | Temp. diff./° C. |
|---|---|
| 0.01 | 0.4 |
| 0.09 | 2 |
| 0.01 | 1.3 |
| 0.04 | 1.3 |
| 0.03 | 1.7 |
| 0.27 | 2.9 |
| 0.29 | 3.4 |

Figure 6:
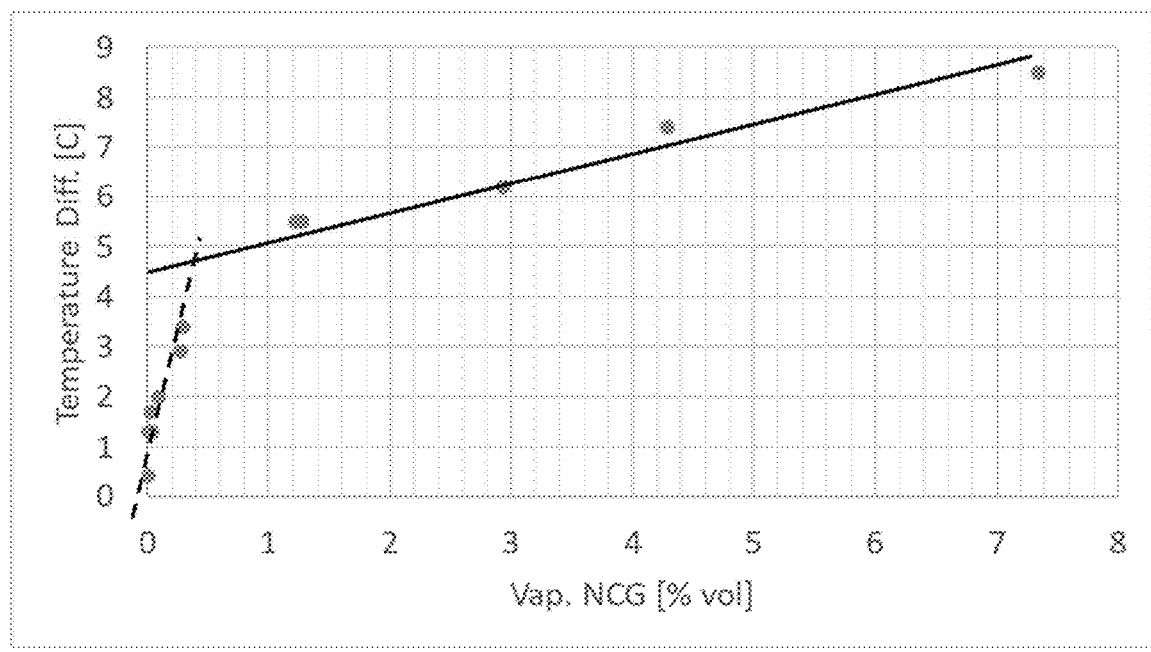
FIG. 6 is a chart of the data reported in Comparative Example 2 and in Example 2.

As can been seen from the data above, the thermal performance of the 1234ze(Z) working fluids of this example is unexpectedly improved, showing a temperature differential in all cases below about 3.5° C., and even more unexpectedly about 3° C. or less for NCG levels of about 0.5% by volume or less. Based on the expectations represented by the results in Comparative Example 1, such a result would not be possible even if NCG levels could be reduced to zero. This is illustrated by FIG. 6, which shows a plot of the data from Comparative Example 2 together with the data from this Example. As is shown in this chart, applicants have discovered an unexpected but highly desirable drop-off in temperature differential for working fluids of this Example, and hence a dramatically and unexpectedly improved thermal performance of the heat pipe.

Example 2B—1234ze(Z) as Working Fluid in Heat Pipe Cooling CPU

Example 2A is repeated, except that heat pipe is located in heat transfer contact with a central processing unit (CPU) for cooling the CPU by rejecting heat to ambient air and/or other heat sink. The thermal performance of the 1234ze(Z) working fluids of this example is unexpectedly improved, showing a temperature differential of below about 3.5° C.

Example 2C—1234ze(Z) as Working Fluid in Heat Pipe Cooling LED

Example 2A is repeated, except that heat pipe is located in heat transfer contact with a light emitting diode (LED) for cooling the LED by rejecting heat to ambient air and/or other heat sink. The thermal performance of the 1234ze(Z) working fluids of this example is unexpectedly improved, showing a temperature differential of below about 3.5° C.

Example 2D—1234ze(Z) as Working Fluid in Heat Pipe Cooling in a Data Center

Example 2A is repeated, except that heat pipe is located in heat transfer contact with one or more components in a data center for cooling such components by rejecting heat to ambient air and/or other heat sink. The thermal performance of the 1234ze(Z) working fluids of this example is unexpectedly improved, showing a temperature differential of below about 3.5° C.

Example 2E—1234ze(Z) as Working Fluid in Heat Pipe Cooling in an Air Craft

Example 2A is repeated, except that heat pipe is located in heat transfer contact with one or more components in an air craft for cooling such components by rejecting heat to ambient air and/or other heat sink. The thermal performance of the 1234ze(Z) working fluids of this example is unexpectedly improved, showing a temperature differential of below about 3.5° C.

Example 2F—1234ze(Z) as Working Fluid in Heat Pipe Cooling in an Air Craft

Example 2A is repeated, except that heat pipe is located in heat transfer contact with one or more components in an air craft for cooling such components by rejecting heat to ambient air and/or other heat sink. The thermal performance of the 1234ze(Z) working fluids of this example is unexpectedly improved, showing a temperature differential of below about 3.5° C.

Example 2G—1234ze(Z) as Working Fluid in Heat Pipe Cooling in a Space Craft

Example 2A is repeated, except that heat pipe is located in heat transfer contact with one or more components in a space craft for cooling and/or heating such components by rejecting and/or absorbing heat to ambient air and/or other heat sink. The thermal performance of the 1234ze(Z) working fluids of this example is unexpectedly improved, showing a temperature differential of below about 3.5° C.

Example 2H—1234ze(Z) as Working Fluid in Heat Pipe Cooling in a Satellite

Example 2A is repeated, except that heat pipe is located in heat transfer contact with one or more components in a satellite for cooling and/or heating such components by rejecting and/or absorbing heat to ambient air and/or other heat sink. The thermal performance of the 1234ze(Z) working fluids of this example is unexpectedly improved, showing a temperature differential of below about 3.5° C.

Example 3A—Heat Pipe Performance with Various Working Fluids

Figure 7:
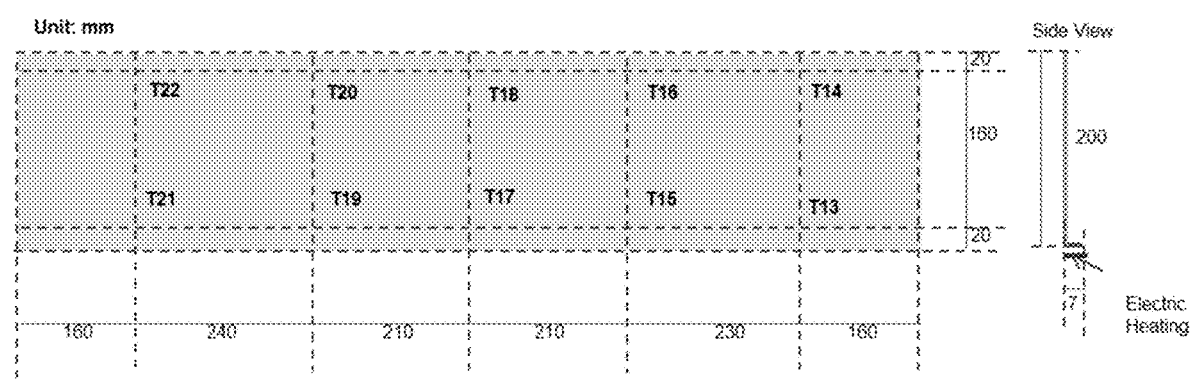
FIG. 7 is a schematic showing the heat pipe used in Example 3

In the Examples that follow, an aluminum, roll-bond, gravity return heat pipe having a width of about 1210 mm and a height of about 200 mm was used. The main section of the heat pipe was disposed in a substantially verticle plane and had a plate thickness of about 1.2 mm. The bend portion of the heat pipe is disposed substantially in a horizontal plane and a had a bend length of about 7 mm. The heat pipe is charged with about 25-40 grams of the indicated working fluid to provide an approximate charge ratio of 30%. The heat pipe is of the type used to cool chips used in LED flat panel TVs, typically in sizes from about 55' to 75'. The heat pipe was provided with a heater and with ten (10) thermocouples located at the approximate locations indicated in FIG. 7 as T13-T22. Thus, the thermocouple pairs T13/T14, T15/T16 each measured the temperature differential between the evaporator section and the condenser section within a section of the heat pipe. These five temperature differentials are then averaged as follows to provide the temperature differential for each working fluid: $\Delta T=((T13-T14)+(T15-T16)+((T17-T18)+(T19-T20)+(T21-T22))/5$. During the testing, the electrical heating located on the bend part of the heat pipe is used to simulate a TV LED chip generating heat. The input voltage to the heat is controlled to achieve a near-junction temperature close to 60° C. For this example, the near-junction temperature was determined as the average of temperatures measured by sensors at the lower position, that is, $(T21+T19+T17+T15+T13)/5$.

The following working fluids are tested: R-1224yf, R1233zd(E), R245fa, R1336mzz(Z), R1234ze(E), HFE-7100, HFE-7000 and HFE-649. In addition, the heat pipe is operated without any working fluid to provide an estimate of the heat effectiveness of an aluminum plate of the same dimensions as a heat sink for comparison purposes. The results are provided in Table 3 below:

TABLE 3

| | R1233zd (E) | R245fa | R1234ze (E) | R1336mzz (Z) | Novec 649 | Novec 7100 | Novec 7000 | Heat sink |
|---|---|---|---|---|---|---|---|---|
| Input Power, W | 133.2 | 135.2 | 147.9 | 134.9 | 89.1 | 88.8 | 106.2 | 103 |
| Near-Junction Temp, ° C. | 61.8 | 63.7 | 61.6 | 62.5 | 60.2 | 55.7 | 66.2 | 64.6 |
| Temp Diff, ° C. | 0.27 | 0.17 | 0.17 | 3.03 | 5.59 | 4.97 | 2.96 | 9.93 |
| Thermal Resistance ° C./W | 0.002 | 0.0013 | 0.0011 | 0.0225 | 0.0627 | 0.0559 | 0.0278 | 0.094 |

Although the test results show that all of the tested working fluids produce results superior to an aluminum heat sink in this application, the results for R1233zd(E), R245fa and R1234ze (E) were all unexpectedly superior to the other tested fluids by an order of magnitude.

Example 3B—Heat Pipe Performance with Various Working Fluids in Cooling CPU

Example 3A is repeated for each of the working fluids in Example 3A, and in addition cisR-1224yd, except that heat pipe is located in heat transfer contact with a central processing unit (CPU) for cooling the CPU by rejecting heat to ambient air and/or other heat sink. The thermal performance of each of the working fluids of this example is unexpectedly improved, showing a temperature differential of below about 3.5° C.

Example 3C—Heat Pipe Performance with Various Working Fluids in Cooling LED

Example 3A is repeated for each of the working fluids in Example 3A, and in addition cisR-1224yd, except that heat pipe is located in heat transfer contact with a light emitting diode (LED) for cooling the LED by rejecting heat to ambient air and/or other heat sink. The thermal performance of each of the working fluids of this example is unexpectedly improved, showing a temperature differential of below about 3.5° C.

Example 3D—Heat Pipe Performance with Various Working Fluids in Data Center

Example 3A is repeated for each of the working fluids in Example 3A, and in addition cisR-1224yd, except that heat pipe is located in heat transfer contact with one or more components in a data center for cooling such components by rejecting heat to ambient air and/or other heat sink. The thermal performance of each of the working fluids of this example is unexpectedly improved, showing a temperature differential of below about 3.5° C.

Example 3E—Heat Pipe Performance with Various Working Fluids in Data Center

Example 3A is repeated for each of the working fluids in Example 3A, and in addition cisR-1224yd, except that heat pipe is located in heat transfer contact with one or more components in an air craft for cooling such components by rejecting heat to ambient air and/or other heat sink. The thermal performance of each of the working fluids of this example is unexpectedly improved, showing a temperature differential of below about 3.5° C.

Example 3E—Heat Pipe Performance with Various Working Fluids in Air Craft

Example 3A is repeated for each of the working fluids in Example 3A, and in addition cisR-1224yd, except that heat pipe is located in heat transfer contact with one or more components in an air craft for cooling such components by rejecting heat to ambient air and/or other heat sink. The thermal performance of each of the working fluids of this example is unexpectedly improved, showing a temperature differential of below about 3.5° C.

Example 3F—Heat Pipe Performance with Various Working Fluids in Space Craft

Example 3A is repeated for each of the working fluids in Example 3A, and in addition cisR-1224yd, except that heat pipe is located in heat transfer contact with one or more components in a space craft for cooling and/or heating such components by rejecting and/or absorbing heat to ambient air and/or other heat sink. The thermal performance of the each of the working fluids of this example is unexpectedly improved, showing a temperature differential of below about 3.5° C.

Example 3G—Heat Pipe Performance with Various Working Fluids in Satellite

Example 3A is repeated for each of the working fluids in Example 3A, and in addition cisR-1224yd, except that heat pipe is located in heat transfer contact with one or more components in a satellite for cooling and/or heating such components by rejecting and/or absorbing heat to ambient air and/or other heat sink. The thermal performance of each of the working fluids of this example is unexpectedly improved, showing a temperature differential of below about 3.5° C.

What is claimed is:

1. A method of transferring heat in a heat pipe comprising:
    (a) providing a heat pipe having evaporator section and a condenser section with a gaseous heat transfer composition in the condenser section, said gaseous heat transfer composition in the condenser section having a percent by volume of total non-condensable gases (NCG) of from 0.2% to not greater than 1%; and
    (b) transferring heat from said heat pipe by condensing said gaseous heat transfer composition in said condenser section, wherein said heat pipe operates with a temperature differential of less than 5° C.

2. The method of claim 1 wherein said gaseous heat transfer composition in the condenser section has a percent by volume of total non-condensable gases (NCG) of not greater than 0.75% and wherein said heat pipe operates with a temperature differential of less than 4° C.

3. The method of claim 1 wherein said gaseous heat transfer composition in the condenser section has a percent by volume of total non-condensable gases (NCG) of not greater than 0.5%, and wherein said heat pipe operates with a temperature differential of less than 3.5° C.

4. The method of claim 1 wherein said gaseous heat transfer composition in the condenser section has a percent by volume of total non-condensable gases (NCG) of from about 0.2% to less than about 0.5% and wherein said heat pipe operates with a temperature differential of less than 3.5° C.

5. The method of claim 4 wherein said gaseous heat transfer composition is selected from the group consisting of cisR1224yd, R1233zd(E), R1336mzz(Z), R1336mzz(E), R1234ze(Z), iso-pentane, HFE-7100, HFE-7000, HFE-649 and combinations of these.

6. The method of claim 1 wherein said gaseous heat transfer composition is a low-pressure working fluid.

7. An electronic component cooled using the method according to claim 4.

8. An electrical/electronic system that has at least one component cooled using the method according to claim 4.

9. An electrical/electronic system of claim 8 selected from LED TV, 5G Active Antenna Unit, 5G Base Band Unit, high power density chips or IGBT.

10. The method of claim 1 wherein said gaseous heat transfer composition is a high pressure working fluid.

11. A method of transferring heat in a heat pipe comprising:
   a) providing a heat pipe having evaporator section and a condenser section with a gaseous heat transfer composition in the condenser section, said gaseous heat transfer composition in the condenser section being selected from the group consisting of cisR1224yd, R1233zd(E), R1336mzz(Z), R1336mzz(E), R1234ze(Z), iso-pentane, HFE-7100, HFE-7000, HFE-649 and combinations of these, wherein said heat transfer composition has a percent by volume of total non-condensable gases (NCG) from about 0.2% to about 0.8% by volume (b) transferring heat from said heat pipe by condensing said gaseous heat transfer composition in said condenser section.

12. An electronic component cooled using the method according to claim 11.

13. A printed circuit board having at least one component thereon, wherein said electronic component is cooled by the method according to claim 11.

14. An electronic system that has at least one component cooled using the method according to claim 11.

15. An electronic system of claim 14 selected from LED TV, 5G Active Antenna Unit, 5G Base Band Unit, high power density chips or IGBT.

16. A cooled electronic component comprising a heat pipe, said heat pipe having evaporator section in thermal communication with the electronic component and a condenser having a gaseous heat transfer composition therein, said gaseous heat transfer composition in the condenser section having a percent by volume of total non-condensable gases (NCG) of from about 0.2% to less than about 0.5%.

17. The cooled electronic component of claim 16 wherein said gaseous heat transfer composition is selected from the group consisting of R1233zd(E), R1336mzz(Z), R1336mzz(E), R1234ze(Z), iso-pentane, HFE-7100, HFE-7000, HFE-649 and combinations of these.

18. A printed circuit board comprising the cooled electronic component of claim 17.

19. The printed circuit board of claim 18 wherein said cooled electronic component is selected from an LED, a 5G Active Antenna Unit, a 5G Base Band Unit, a high power density chip and/or IGBT.

\* \* \* \* \*